(12) United States Patent
Nikles et al.

(10) Patent No.: US 12,143,778 B2
(45) Date of Patent: Nov. 12, 2024

(54) METHOD FOR PRODUCING A HEARING AID WITH AN ANTENNA MODULE, AND HEARING AID

(71) Applicant: Sivantos Pte. Ltd., Singapore (SG)

(72) Inventors: Peter Nikles, Erlangen (DE); Johannes Kuhn, Fuerth (DE); HouQuan Chong, Singapore (SG)

(73) Assignee: Sivantos Pte. Ltd., Singapore (SG)

( * ) Notice: Subject to any disclaimer, the term of this patent is extended or adjusted under 35 U.S.C. 154(b) by 302 days.

(21) Appl. No.: 17/749,377

(22) Filed: May 20, 2022

(65) Prior Publication Data

US 2022/0279295 A1 Sep. 1, 2022

Related U.S. Application Data

(63) Continuation of application No. PCT/EP2020/079102, filed on Oct. 15, 2020.

(30) Foreign Application Priority Data

Nov. 20, 2019 (DE) ...................... 10 2019 217 861.8

(51) Int. Cl.
*H04R 25/00* (2006.01)
*H05K 9/00* (2006.01)

(52) U.S. Cl.
CPC ......... *H04R 25/609* (2019.05); *H04R 25/554* (2013.01); *H04R 25/602* (2013.01);
(Continued)

(58) Field of Classification Search
CPC .. H04R 25/554; H04R 25/602; H04R 25/604; H04R 25/609; H04R 25/658;
(Continued)

(56) References Cited

U.S. PATENT DOCUMENTS 5,436,803 A 7/1995 Annis et al.
7,260,234 B2 8/2007 Kasztelan et al.
(Continued)

FOREIGN PATENT DOCUMENTS

CN 202385276 U 8/2012
CN 104170407 A 11/2014
(Continued)

OTHER PUBLICATIONS

Anonymous: "101 EMI Shielding Tips and Tricks" archived by Wayback Machine Internet Archive, Nov. 5, 2017 (Nov. , 2017), pp. 1-23, XP055793023 Found in Internet: URL: https://web.archive.org/web/20171105215145/https://hollandshielding.com/Shielding-tips-and-tricks [found Apr. 7, 2021] * item 76 *.
(Continued)

*Primary Examiner* — Huyen D Le
(74) *Attorney, Agent, or Firm* — Laurence A. Greenberg; Werner H. Stemer; Ralph E. Locher

(57) ABSTRACT

A hearing aid, in particular an in-the-ear hearing aid, has a housing in which an antenna module is arranged. The antenna module has a winding and a receptacle space in which an electronic component, such as an earphone, is arranged. The antenna module is prefabricated in that an assembly body is provided to which a magnetic layer and then the winding are applied. The assembly body defines the receptacle space and is designed for this purpose optionally as a tubular hollow body having a cavity forming the receptacle space or the assembly body is alternatively removed so that the receptacle space is formed by the removal. The electrical component is then inserted into the receptacle space of the prefabricated antenna module and the unit, consisting of the component and the antenna module, is placed in the housing.

12 Claims, 11 Drawing Sheets

(52) U.S. Cl.
CPC ......... *H04R 25/604* (2013.01); *H04R 25/658* (2013.01); *H05K 9/0084* (2013.01); *H04R 2225/025* (2013.01); *H04R 2225/51* (2013.01); *H04R 2225/57* (2019.05)

(58) Field of Classification Search
CPC .......... H04R 2225/025; H04R 2225/49; H04R 2225/51; H04R 2225/57; H01F 38/14; H01F 27/40; H01F 27/366; H01F 27/325; H05K 9/0084
See application file for complete search history.

(56) References Cited

U.S. PATENT DOCUMENTS

| | | | |
|---|---|---|---|
| 8,649,542 | B2 | 2/2014 | Huettinger |
| 9,253,582 | B2 | 2/2016 | Nikles et al. |
| 9,426,588 | B2 | 8/2016 | Vonlanthen et al. |
| 9,521,494 | B2 | 12/2016 | Nikles |
| 10,021,495 | B2 * | 7/2018 | Vonlanthen .......... H04R 25/652 |
| 10,536,788 | B2 | 1/2020 | Nikles et al. |
| 11,070,928 | B2 | 7/2021 | Meier et al. |
| 11,183,762 | B2 | 11/2021 | Kuhn et al. |
| 2004/0028251 | A1 | 2/2004 | Kasztelan et al. |
| 2011/0194717 | A1 | 8/2011 | Hansen et al. |
| 2016/0241063 | A1 | 8/2016 | Hatanaka et al. |
| 2017/0201821 | A1 | 7/2017 | McAuliffe et al. |
| 2018/0007478 | A1 | 1/2018 | Nikles et al. |
| 2019/0006757 | A1 | 1/2019 | Nikles et al. |
| 2022/0131425 | A1 * | 4/2022 | Nikles .................. H02J 50/10 |

FOREIGN PATENT DOCUMENTS

| | | |
|---|---|---|
| CN | 104779439 A | 7/2015 |
| CN | 107889554 A | 4/2018 |
| CN | 108322881 A | 7/2018 |
| DE | 10236940 B3 | 2/2004 |
| DE | 102018214199 B3 | 1/2020 |
| EP | 2811761 A1 | 12/2014 |
| EP | 3413587 A1 | 12/2018 |
| EP | 3520439 A1 | 8/2019 |
| GB | 2569536 A | 6/2019 |
| JP | 2012090139 A | 5/2012 |

OTHER PUBLICATIONS

Tim Williams, "15.1.2 LF magnetic fields", In: "EMC for Product Designers", pp. 438-439, Sep. 26, 2016 (Sep. 26, 2016), Newnes, Elsevier Science & Technology, XP055761165, ISBN: 9780081010167, the whole document.

* cited by examiner

METHOD FOR PRODUCING A HEARING AID WITH AN ANTENNA MODULE, AND HEARING AID

CROSS-REFERENCE TO RELATED APPLICATION

This application is a continuation, under 35 U.S.C. § 120, of copending International Patent Application PCT/EP2020/079102, filed Oct. 15, 2020, which designated the United States; this application also claims the priority, under 35 U.S.C. § 119, of German Patent Application DE 10 2019 217 861.8, filed Nov. 20, 2019; the prior applications are herewith incorporated by reference in their entirety.

FIELD AND BACKGROUND OF THE INVENTION

The invention relates to a method for producing a hearing aid and a hearing aid, in particular an in-the-ear (ITE) hearing aid device.

A "hearing aid" is understood in general as a device which is designed to process and present sound or a sound signal to a person. The present invention relates especially to a hearing aid device. This is understood as a hearing aid which is used to care for a hearing-impaired person using acoustic ambient signals. The acoustic ambient signals are processed and typically amplified for compensation or also therapy of a respective hearing impairment. Such a hearing aid device consists in principle of one or more input transducers, a signal processing unit, an amplifying unit, and an output transducer. The input transducer is generally a sound receiver, for example, a microphone, and/or an electromagnetic receiver, for example, an induction coil. The output transducer is generally implemented as an electroacoustic transducer, for example, a miniature loudspeaker, or as an electromechanical transducer, for example, a bone-conduction receiver. It is also referred to as a receiver. The output transducer generates output signals which are conducted to the sense of hearing of the patient (hearing-impaired person) and are supposed to generate a hearing perception in the patient. The amplifier is generally integrated in the signal processing unit. The power supply of the hearing aid is carried out by a battery integrated in the housing of the hearing aid. (Hearing aid) components are typically arranged on a printed circuit board as a circuit carrier or connected thereto.

There are different embodiment variants of hearing aids, in particular of hearing aid devices. These are in particular ITE hearing aids (in-the-ear), BTE hearing aids (behind-the-ear), RIC hearing aids (receiver-in-canal), CIC hearing aids (completely-in-canal). The latter are equivalent to the ITE hearing aids, but are worn completely in the auditory canal. In the ITE hearing aids, the housing, which contains all functional components including microphone and receiver, is worn at least partially in the auditory canal. Especially ITE or also CIC hearing aids therefore have a very small structural form.

Hearing aids, especially hearing aid devices, often have an antenna arrangement which is used, for example, for wireless transmission of data signals or acoustic signals. The antenna arrangements can be provided for different intended purposes. For example, the antenna arrangement is used for wireless communication with a further device, for example, with a further hearing aid device in the case of a binaural system. In addition, such an antenna arrangement can also be designed for wireless communication with another external device, for example, a playback device for music and speech. In addition, the antenna arrangement can also be used for wireless, in particular inductive charging of a battery of the hearing aid device. Due to the limited space conditions, in the case of an antenna arrangement, a shield is often required and desired between the antenna arrangement and further electrical components to avoid undesired mutual interference.

An ITE hearing aid device is disclosed in our commonly assigned U.S. Pat. No. 9,521,494 B2 and its counterpart European published patent application EP 2 811 761 A1. There, a shielding screen, which is integrally formed with a coil core, is arranged between a receiver and an antenna arrangement, which has a coil.

A further hearing aid device is disclosed in our commonly assigned U.S. Pat. No. 10,536,788 B2 and its counterpart European published patent application EP 3 413 587 A1. There, a winding of an antenna arrangement is arranged on an energy accumulator (battery) with a foil shield interposed.

Especially in hearing aids having small constructions, the most compact possible arrangement of the components of the hearing aid is required. The mutual influencing of the components due to electromagnetic influences can be problematic here. In particular, an electromagnetic output transducer (receiver) generates a strong radiation. In general, the highest possible sensitivity of the antenna arrangement is desired with the least possible mutual influencing at the same time.

If a winding formed as a coil is used for the antenna arrangement which is wound around a component, for example, the receiver, this requires a certain level of effort during the production since the coil has to be wound around the receiver.

SUMMARY OF THE INVENTION

It is accordingly an object of the invention to provide a hearing aid and a method of producing a hearing aid which overcome the above-mentioned disadvantages of the heretofore-known devices and methods of this general type and which enable a hearing aid having an antenna arrangement which has a compact construction and is simple to manufacture.

With the above and other objects in view there is provided, in accordance with the invention, a method for producing a hearing aid with a housing and an antenna module arranged in the housing, the antenna module having a winding and a receptacle space, and an electronic component of the hearing aid arranged in the receptacle space. The method comprises:
  providing a prefinished antenna module by:
    providing an assembly body;
    applying a magnetic layer to the assembly body and subsequently applying the winding to the assembly body;
    the assembly body defining the receptacle space;
    alternatively forming the assembly body as a sleeve-shaped hollow body having a cavity defining the receptacle space or removing the assembly body to define the receptacle space being a free space formed by a removal of the assembly body;
  subsequently introducing the electrical component into the receptacle space of the prefinished antenna module; and
  placing a unit consisting of the electrical component and the antenna module into the housing.

The above and other objects are achieved according to the invention by a method for producing a hearing aid, in particular an ITE (in-the-ear) or also an RIC (receiver-in-canal) hearing aid device. The device has a housing in which an antenna module is arranged, which has a winding and a receptacle space, in which an electrical component, in particular a receiver is arranged. For the production of the hearing aid, firstly, the antenna module is prefinished. For this purpose, an assembly body is provided and the winding is attached at least indirectly to the assembly body. The assembly body defines the receptacle space. According to a first variant, it is designed for this purpose as a hollow body and in particular like a sleeve, wherein the cavity forms the receptacle space. According to a second alternative, the assembly body forms the receptacle space insofar as it is removed after the formation of the winding and the free space thus provided forms the receptacle space. The electrical component, thus in particular the receiver, is subsequently introduced, in particular inserted, into this receptacle space. This structural unit, consisting of the component and the antenna module, is placed in the housing in the finally finished state. The structural unit is preferably first prefinished and then placed in the housing. Alternatively, there is also the possibility in principle of first placing the antenna module in the housing and only then introducing the component into the receptacle space of the antenna module.

Providing the prefinished antenna module having the receptacle space and the prepared winding is of particular significance. A winding is understood in particular as a coil in the present case, which is thus wound circumferentially around the electrical component. This coil is therefore wound around the assembly body during the production of the antenna module. It is essential that the formation of the coil on the assembly body takes place without the component being present during the formation of the coil. This is based on the consideration that the component, especially the receiver, is a comparatively expensive component and in the event of an installation error, the entire structural unit having the receiver has to be considered a discard. Due to the method according to the invention having the winding around the assembly body, the antenna module is tested for its functionality subsequent to this pre-finishing step, thus before the component is installed. In case of an installation error, only the antenna module has to be discarded.

The antenna module is manufactured as a whole in a pre-finishing step as an independent structural unit. The object is accordingly also achieved according to the invention by the production of such an antenna module, which is then installed later in a hearing aid.

The antenna module is also formed with a magnetic layer, in particular a magnetic foil layer and especially a ferrite foil. It is advantageous to first apply the magnetic layer to the assembly body before the winding is subsequently applied. In particular, the assembly body is therefore wrapped using the magnetic foil layer and subsequently a coil wire is wound around this foil layer to form the winding.

The receptacle space and the electrical component each extend in a longitudinal direction and each have a length. The magnetic layer furthermore has at least one tab, which extends beyond the length of the receptacle space and/or beyond the length of the electrical component. Multiple tabs are preferably provided, wherein tabs opposite to one another enclose and delimit an intermediate space between them, which is formed inside the housing of the hearing aid. This intermediate space preferably widens starting from the receptacle space in the longitudinal direction, i.e., a cross-sectional area enlarges perpendicular to the longitudinal direction.

Finally, in one preferred design, an electrical shielding layer is furthermore arranged, which is formed in particular as a metallic foil, especially a copper foil.

Together with the magnetic layer, this expediently forms a multilayer shielding foil, especially having a metallic (Cu) foil layer and a magnetic foil layer. The magnetic layer can also be formed by multiple strips, wherein preferably one strip is applied in each case to one side of the component, which is rectangular in cross section. A slotted foil is preferably used, so that this thus forms the individual tabs in a front subsection by way of longitudinal slots.

The magnetic layer is functionally formed as a whole like a coil core, due to which the sensitivity of the antenna arrangement as a whole is positively influenced. Due to the extension of the magnetic layer beyond the components, this function of the coil core is first amplified. Moreover, magnetic field lines are guided in and through this magnetic tab by the at least one protruding magnetic tab, which has the result that the intermediate space is loaded less by magnetic fields, than this would be without the at least one tab.

One particular advantage of this arrangement can thus be considered that due to the tab adjoining the electrical component, an (additional) intermediate space is formed, which as a result of the tabs defines an additional "shielded" subsection inside the housing. This intermediate space is suitable for arranging further hearing aid components.

The intermediate region is effectively shielded via the electrical shielding layer, so that interference effects are reduced.

The term "electrical shielding layer" is understood in general as a highly conductive layer, the electrical conductivity of which is in particular significantly greater (for example, by at least a factor of 5) than that of the magnetic layer. Vice versa, the permeability of the magnetic layer is preferably greater, in particular significantly greater (by at least a factor of 5) than the permeability of the electrical shielding layer.

Due to this (foil) structure, good shielding and, on the other hand, a high sensitivity of the antenna module, which forms an antenna arrangement, is achieved. Especially, due to this structure, at most minor eddy currents are induced in the shielding foil and therefore only very minor heating takes place. Furthermore, the magnetic field lines extend within the magnetic layer.

Overall, the intermediate space—if one observes external fields—is quasi-field-free (H field, E field) and is particularly suitable for arranging components. Vice versa, components possibly arranged in the intermediate space are shielded to the outside and therefore influence the performance of the antenna module/the antenna arrangement barely or not at all.

One particular advantage of the shielding of the intermediate space can be seen in a design of the antenna module for inductive charging. In inductive charging, eddy currents are often induced in a housing of a battery, which, inter alia, results in undesired heating of the battery. Due to a preferred arrangement of the battery in the intermediate space, this is therefore arranged more or less in the field free space, so that no eddy currents are induced.

The relative permeability of the magnetic layer is dependent, inter alia, on the frequency (resonance frequency), to which the antenna arrangement is tuned for transmitting/receiving (data) signals. The antenna arrangement is especially designed in the present case for data transmission at frequencies in the megahertz range, especially in the range between 1 to 20 MHz, in particular in the range of 3 MHz. In principle, the antenna arrangement can also be designed, however, for transmitting/receiving in the double-digit or triple-digit megahertz range (for example up to 300 MHz). For other applications, the antenna arrangement is tuned to a resonance frequency in the gigahertz range.

In alternative variants, the antenna arrangement is designed for other intended uses, for example, for inductive charging, typically at frequencies in the kilohertz range, or also as a telecoil antenna for frequencies down into the hertz range.

The magnetic layer preferably has—in particular in the case of an antenna arrangement tuned to the megahertz range, especially to the range between 1 and 20 MHz—a relative permeability in the range between 40 and 700, preferably in the range between 100 and 300. Smaller relative permeabilities are selected for the magnetic foil with increasing frequencies for which the antenna arrangement is designed. The relative permeability is at least >1 here, however, so that the magnetically permeable material used is at least paramagnetic. The relative permeability is preferably much greater than 1 (at least 5, preferably at least 10), so that the permeable material is generally ferromagnetic or ferrimagnetic.

The electrical shielding layer is in particular thinner than the magnetic layer. The magnetic layer preferably has a thickness in the range of at least 25 µm, preferably at least 50 µm or at least 100 µm. The thickness is at most, for example, 500 µm and preferably at most 200 µm or at most 300 µm. Especially in some embodiment variants, the thickness of the magnetic layer, especially the thickness of the ferrite foil, is in the range between 200 and 300 µm. Good performance and a high sensitivity of the antenna arrangement is achieved by this—in comparison, for example, to very thin layers in the range of 25 µm to 100 µm. In this way, the (bending) flexibility of the magnetic layer, and thus of the entire shielding foil, is reduced at the same time. The thickness of the electrical shielding layer, especially the copper foil or copper layer, is typically in the range between 5 µm and 50 µm and preferably typically in the range between 15 to 35 µm. For applications in a low frequency range, for example, for inductive charging, thicker foils are preferably also used, for example, having a thickness in the range between 40 µm to 80 µm.

An assembly body which has a greater length than the electrical component is preferably used for the production of the antenna module. The length of the assembly body is expediently at least as long as the magnetic layer including the tabs (viewed in the longitudinal direction). The magnetic layer, thus especially the magnetic ferrite foil, can therefore be applied completely to the assembly body by this measure.

The assembly body expediently in general has a winding region and a tab region adjoining thereon. The winding and thus the coil is applied in the winding region and the tab region is used to deposit or support the tabs of the magnetic layer. The individual tabs are preferably laid on the assembly body like strips in this tab region.

This assembly body preferably has peripheral webs or grooves on its lateral surfaces, especially in the tab region, in which the individual strip-shaped tabs are inserted. The width of the grooves corresponds to the width of the respective tabs.

The assembly body is typically—like the electronic component—rectangular in cross section and overall formed approximately cuboid.

At its end arranged opposite to the tab region, the assembly body has a stop protruding in the radial direction. This means that a web extending perpendicularly to the longitudinal direction adjoins the end of the winding region, which forms the stop. The magnetic layer is applied to this stop.

In one preferred design, this stop is part of a separate stop element, which is reversibly connected to the remaining assembly body, i.e., the stop element can be removed from the remaining assembly body and fastened thereon again. In particular, the stop element has a plug element, which is plugged into the remaining assembly body.

In one preferred design, furthermore an adapter housing is provided, which—in particular after the removal of the stop element—is pushed over at least a part of the winding region and the winding lying therein. This takes place in particular before the arrangement of the receiver in the receptacle space, thus during the formation of the prefinished antenna module.

Alternatively to this variant, in which the adapter housing is pushed over the winding, the adapter housing itself forms the assembly body and the winding is circumferentially attached in a winding region of the adapter housing around it.

In both cases, in the case of the design of the electrical component as a receiver, this is inserted with one end face in front into the adapter housing. The receiver has a sound outlet opening on this end face. The adapter housing therefore preferably correspondingly also has an opening, in particular a sound outlet nozzle, on an end-face end.

The sound outlet nozzle generally forms an attachment element especially for attaching an ear mold, which is typically shaped specifically for the user. During the use of the hearing aid, the hearing aid is inserted with the ear mold in front into the ear canal of the user.

The adapter housing is generally guided through a wall of the housing of the hearing aid, at least in the region of its sound outlet nozzle, to be able to attach the ear mold from the outside.

For simple installation of the adapter housing in the housing of the hearing aid, the adapter housing furthermore has a stop, which abuts the wall of the housing of the hearing aid in the installed final position.

The winding generally has two winding ends, which are electrically contacted for the attachment of the winding and its connection to further electronic components, for example, amplifier, filter, analog-to-digital converter, signal processor. To simplify the electrical contacting of the winding ends and thus the coil, a printed circuit board, in particular a flexible printed circuit board is expediently provided. This preferably has two contact surfaces, on each of which one respective winding end is contacted.

The winding and thus the coil expediently has a winding length viewed in the longitudinal direction. The two contact surfaces are in particular spaced apart from one another in the longitudinal direction by at least the winding length, so that one winding end can be contacted with a respective contact surface at each end.

The printed circuit board is preferably laid on the assembly body, preferably directly, thus before the magnetic layer and/or the winding is applied.

In one expedient design, the printed circuit board has a winding section and a tab section. The winding is applied later in the region of the winding section and the tab section adjoining thereon in the longitudinal direction is later arranged in the region of the tabs of the magnetic layer. A tab is therefore preferably attached to the tab section.

The contact surfaces are preferably arranged in the region of the winding section. Conductor tracks are expediently guided in the longitudinal direction from the respective contact surfaces, which extend up into the tab section and form connection parts at the end, so-called connection pads, and which are formed in particular for an attachment of a conducting wire.

These connection pads for the wiring are preferably arranged on a lower side of the printed circuit board facing inward, whereas the contact surfaces are arranged on an opposing outer side of the printed circuit board. Therefore, the electrical connection is guided from the contact surfaces to the connection pads through the printed circuit board, for example, in the manner of a via known per se.

The contacting of the winding ends and usually also the connection of the wiring is carried out, for example, by soldering or welding. In both cases, an introduction of heat occurs. To prevent damage, a good heat dissipation is required during this. This applies especially in the region of the contact surfaces. The contact surfaces are preferably formed extensively in consideration of the best possible heat dissipation. This is understood to mean that they occupy a significantly larger area than is required for the actual contacting. For example, the contact surfaces each occupy 5-10% of the area of the printed circuit board in the winding region.

According to one embodiment variant, the printed circuit board is only arranged on one of the longitudinal sides of the component or the assembly body. This is sufficient for the electrical contacting. Alternatively thereto, the printed circuit board, in particular in the design as a flexible printed circuit board, is also arranged around the assembly body or at least the component.

In general, it is furthermore provided that further electrical or electronic components are arranged on the printed circuit board, in particular on its tab section extending beyond the electrical component. These are arranged on the inside oriented toward the intermediate space and/or also on an outside, thus between the tab section and a wall (outer wall) of the housing of the hearing aid. For example, an integrated circuit, for example, for a charging circuit, is arranged directly on the printed circuit board.

In one expedient design, the printed circuit board itself has the above-mentioned electrical shielding layer. In particular, the printed circuit board has a continuous metallic plane for this purpose. The printed circuit board is in particular a printed circuit board having multiple planes, one of these planes thus forms an electrical shielding layer in this regard.

In the design in which the magnetic shielding layer is arranged between the winding and the printed circuit board, in one preferred design, the magnetic layer has windows, thus recesses, in the region of the contact surfaces, so that contacting of the winding ends with the contact surfaces is enabled.

In one preferred design, the hollow body prepared with the winding, for example, also in the design as an adapter housing, is pushed over the component or this component is plugged into the hollow body. The magnetic layer is located between the hollow body and the component in some embodiment variants. In these embodiment variants, the magnetic layer is therefore not applied to the assembly body. The attachment of the magnetic layer takes place, for example, before the hollow body is pushed on. In this case, the magnetic layer, especially the ferrite foil or also the combined shielding foil, is first attached to the receiver (electronic component), before the hollow body is pushed on. Alternatively thereto, the magnetic layer is only attached subsequently, is thus inserted between the component and the hollow body. At least a minor clearance is provided between the hollow body and the component for this purpose. Especially in this case, strip-shaped elements are inserted on each longitudinal side of the cuboid component. Alternatively, the magnetic layer is formed like a sleeve and is inserted as such.

The hollow body itself furthermore has, in one preferred design, connection points or connection pads for the attachment of a wire especially, so that the winding can thus be electrically connected as described above to a further electronic component.

According to a first embodiment variant, the hollow body consists of a nonconductive material and is in particular formed like a plastic sleeve. Alternatively thereto, it consists of a conductive material and is formed in particular as a metal sleeve. Effective electrical shielding of the receiver is insofar already achieved in this case.

With the above and other objects in view there is also provided, in accordance with the invention, a hearing aid, comprising:

a housing;
an antenna module disposed in said housing, said antenna module being formed with a receptacle space in which at least one electrical component is arranged. The electrical component extends in a longitudinal direction. The antenna module has a winding that is at least indirectly arranged on the electrical component and a magnetic layer arranged between the winding and the electrical component;
the magnetic layer having a subsection arranged on the electrical component and at least one tab adjoining the subsection in the longitudinal direction, the at least one tab protruding in the longitudinal direction beyond the electrical component, and the tab delimiting an intermediate space adjoining the electrical component in the longitudinal direction.

In other words, the objects of the invention are also achieved by a hearing aid, as claimed. The housing of the hearing aid typically has an interior changing in one direction. In the case of an ITE housing, the interior typically widens from an eardrum side of the housing toward a side facing away. The term "eardrum side" is understood as that side of the housing which, when the housing is inserted into the auditory canal, the eardrum side faces toward the eardrum of a person.

The hearing aid has at least one electrical component arranged in the housing, which extends in a longitudinal direction. This is generally a hearing aid component, which thus has a hearing aid functionality. It is preferably the receiver. Furthermore, an antenna module, also referred to as an antenna arrangement, is integrated in the housing, which has a winding arranged on the electrical component. Furthermore, a magnetic layer made of a magnetic, thus permeable material is arranged between the component and the winding. The winding is in particular wound like a coil with the magnetic layer interposed around the electrical component. The magnetic layer has a subsection extending along the electrical component. The subsection is arranged in one preferred design circumferentially around the electrical component. Furthermore, the magnetic layer has at least one and preferably multiple tabs adjoining this subsection and thus also the electrical component in the longitudinal direction. The at least one tab and preferably the multiple tabs therefore protrude beyond the electrical component. The at least one protruding tab delimits an intermediate space which is formed at least by a partial space of the interior of the housing. The intermediate space is delimited, for example, on one side by the at least one tab and on the other side by an (opposing) inner wall of the housing. In the case of multiple tabs, these preferably enclose the intermediate space between them.

The most efficient possible space utilization, especially in an ITE hearing aid, is achieved by this measure. This is because in such an ITE hearing aid, the device typically has a first housing section having smaller cross-sectional area, which is adapted to the auditory canal, on which a second widening housing section adjoins, in which multiple further hearing aid components are arranged. The electrical component enclosed by the shielding foil is arranged in the first housing section having the small cross section. In particular the enlarging interior in the second housing section is therefore efficiently shielded by the widening tabs.

The advantages and preferred designs set forth in conjunction with the method for producing the hearing aid are also to be transferred accordingly to the hearing aid.

The intermediate space, in particular the intermediate space formed between two tabs, preferably widens in the longitudinal direction. A distance between the at least one tab and, for example, the opposing inner wall of the housing or also the distance between two tabs, which are opposing in particular, therefore enlarges viewed in the longitudinal direction.

Further components, for example, battery, circuits, signal processing unit, additional coils, for example, charging coil and telecoil, are preferably arranged in this intermediate space.

As mentioned, the hearing aid is advantageously an ITE hearing aid, in particular an ITE hearing aid device.

Other features which are considered as characteristic for the invention are set forth in the appended claims.

Although the invention is illustrated and described herein as embodied in a method for producing a hearing aid, and a hearing aid, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Identically acting parts are provided with identical reference signs throughout the figures.

DETAILED DESCRIPTION OF THE INVENTION

Figure 1:
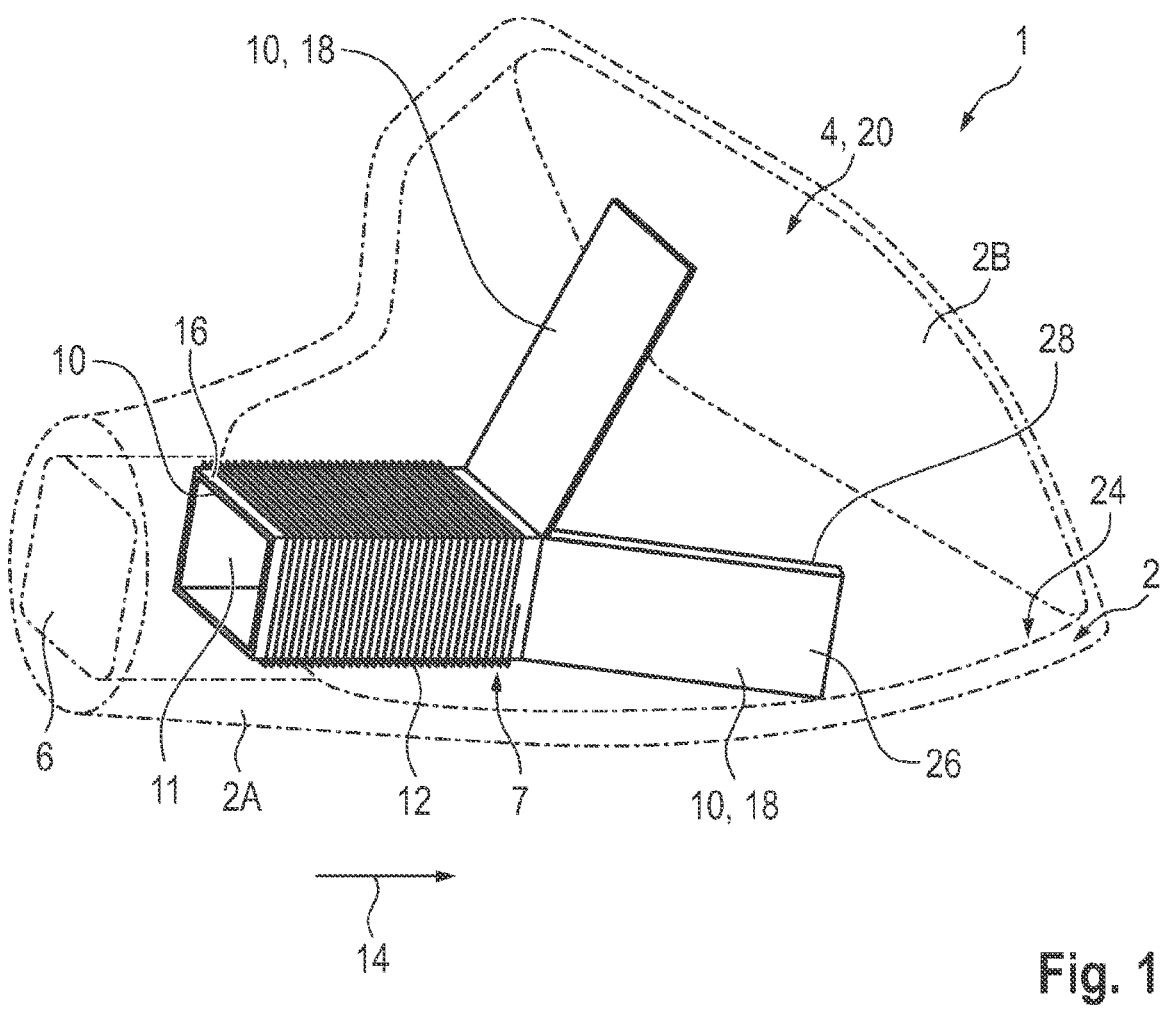
FIG. 1 shows an illustration of a housing of an ITE hearing aid device having an antenna arrangement inserted therein.

Referring now to the figures of the drawing in detail and first, in particular, to FIG. 1 thereof, there is shown a partial view of an ITE (in-the-ear) hearing aid device 1. The device has a housing 2. The housing 2 has a first housing section 2A and a second housing section 2B adjoining thereon. The first housing section 2A extends from an eardrum-side end in the direction toward the second housing section 2B, which ends at a side facing away from the eardrum side. The first housing section 2A is designed to be at least partially inserted into the auditory canal of a person, who may be hearing-impaired. Starting from the first housing section 2A, the second housing section 2B adjoins thereon and widens as a whole. This also forms a widening interior 4.

The second housing section 2B has a comparatively extensive opening at the end. This is typically terminated by a so-called faceplate, thus a component carrier on which connections, operating elements, or also hearing components are often arranged. Further components (partially not illustrated further here), such as battery, signal processing unit, microphones, etc. are arranged in the housing 2.

The first housing section 2A has an opening 6 on the eardrum side at the end, from which sound exits in the direction toward the eardrum. A receiver 8 is typically inserted in the first housing section 2A as an electrical component, which extends at least somewhat into the opening 6 (the receiver 8 is not shown in FIG. 1). An antenna module 7 also referred to as an antenna arrangement is thus inserted inside the housing 2, which has as essential components a shielding foil 10 and a winding 12 formed as a coil. The winding 12 and a part of the shielding foil 10 enclose a receptacle space 11, in which the receiver 8 is arranged in the installed state. The winding 12 is only arranged in the region of the receiver 8 here. This and thus the receptacle space 11 enclosed by the winding 12 extend here in a longitudinal direction 14, which is oriented away from the eardrum side of the housing 2.

The shielding foil 10 generally has a subsection 16, which is laid circumferentially around the receiver 8. Viewed approximately in the longitudinal direction 14, individual (shielding) tabs 18, in which the shielding foil 10 is extended, adjoin this subsection 16. In the typical design of the receiver 8 as a cuboid component, one cuboid side is extended in each case by a respective tab 18. The individual tabs 18 are separated from one another at least outside the subsection 16. The winding 12 is only arranged around the shielding foil 10 in the region of the subsection 16.

Adjoining the subsection 16, the tabs 18 widen, so that thus an intermediate space 20 formed between them— viewed in the longitudinal direction 14—widens. To enable this, the respective tabs 18 the respective tab 18 is, for example, bent or curved at the transition between a respective tab 18 to the subsection 16.

In particular, the individual tabs 18 cling to an inner wall 24 of the housing 2, especially in the region of the second, widening housing section 2B. The tabs 18 are preferably fastened at least in points or also in a planar manner on the inner wall, in particular by adhesive bonding.

The shielding foil 10 is formed in multiple layers and has at least two layers, namely a magnetic layer 26, which is formed in particular by one or more ferrite foils, and an electrical shielding layer 28, which is formed in particular by a foil or layer having good electrical conductivity. The electrically conductive material is in particular copper. The electrical shielding layer is oriented here in the direction toward the receiver 8 and the magnetic layer 26 is arranged between the electrical shielding layer 28 and the winding 12.

In a first embodiment variant, the shielding foil 10 is formed by the electrical shielding layer 28, in particular copper foil, and the magnetic layer 26 attached thereon, in particular by adhesive bonding. This layer is applied, for example, over the full surface to the shielding layer 28. The magnetic layer 26 is preferably formed, however, by individual strips extending in the longitudinal direction, which are applied individually to the electrical shielding layer (in particular copper foil) 28. These individual strips 30 are each foil-like strips, especially ferrite foil strips.

The production of the antenna module 7 and different embodiment variants of the antenna module 7 are explained in more detail hereinafter on the basis of FIGS. 2-6.

In all variants described hereinafter, an assembly body 40 is used, which is used either solely as an auxiliary element and is removed after the production of the antenna module 7 (variant according to FIG. 2), or it is part of the antenna module 7 (embodiment variant according to FIGS. 3-6). In principle, the production of the antenna module 7 is carried out without the receiver 8. Alternatively thereto, the different configurations as are shown in FIGS. 2-6 can also in principle be achieved with the use of the receiver 8 during the production, however.

In the embodiment variant of FIG. 2, in particular a solid assembly body 40 is used, which extends in the longitudinal direction 14. On its eardrum-side end, it has a stop 42, which is adjoined first by a winding region 44 and then a tab region 46. The assembly body 40 has a length L1, which is longer than a length L2 of the receiver 8. In the tab region 46, the cuboid assembly body 40 has a web on each of the longitudinal edges, so that a groove or depression 48 is formed on each cuboid side in the tab region 46.

Figure 2A:
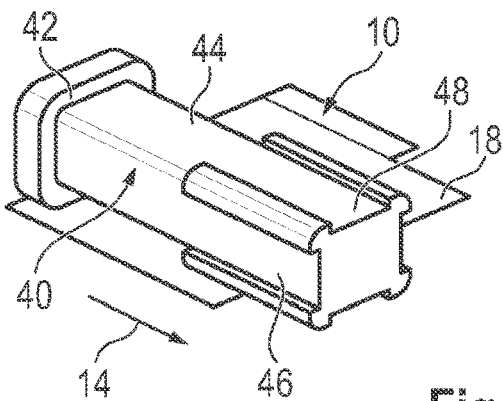
FIGS. 2A-2G are perspective illustrations to explain a first variant of the production of an antenna module.
Figure 2B:
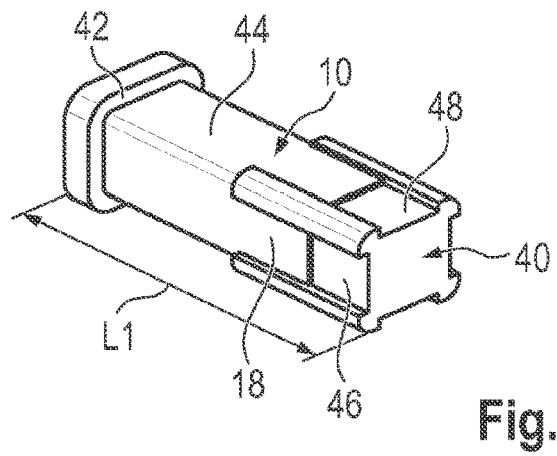
Figure 2C:
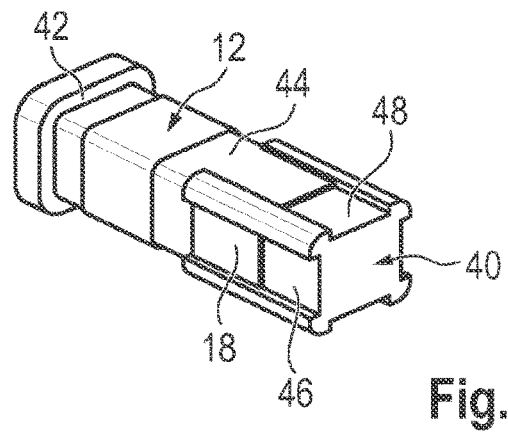

In a first step, the shielding foil 10 is laid around the assembly body 40. The shielding foil 10 is in particular a slotted foil comparable to the shielding foil 10, as shown in FIG. 2A. The eardrum-side subregion 16 is circumferential and a free tab 18 protrudes on each cuboid side.

Figure 2D:
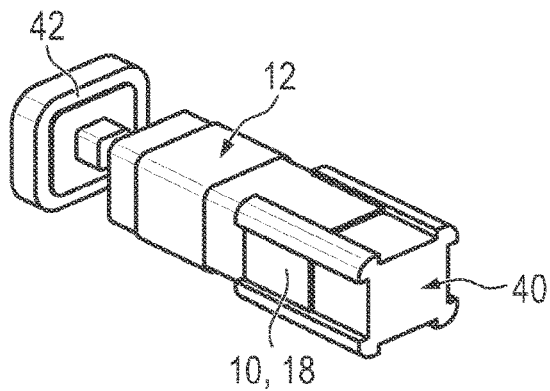
Figure 2E:
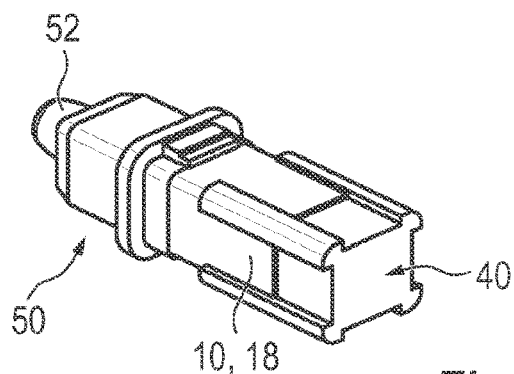
Figure 2F:
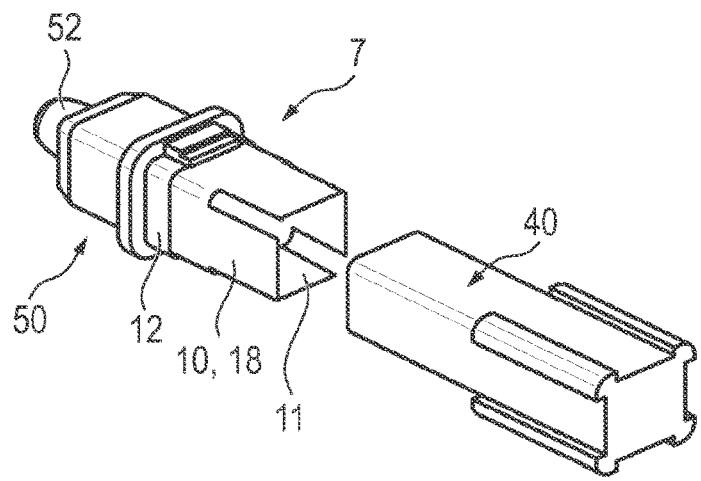
Figure 2G:
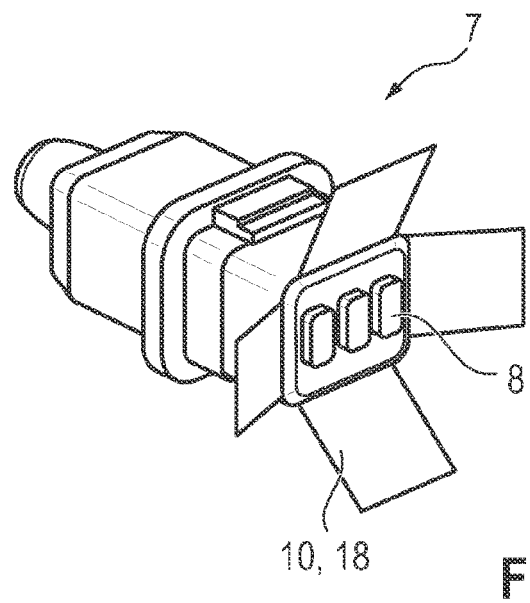

In the illustrated exemplary embodiment, the stop 42 is part of a stop element which is pluggable into the remaining assembly body 40 by means of a pin. This stop element is removed in the next installation step (FIG. 2D). An adapter housing 50 is then pushed over the winding region 44 from the eardrum-side end. The adapter housing 50 has a sound outlet nozzle 52 at the eardrum-side end. In the next step shown in FIG. 2F, finally the assembly body 40 is removed, so that the antenna module 7 is formed. In the receptacle space 11 now exposed by the assembly body 40, the receiver 8 is subsequently plugged in. The cross-sectional contour of the receptacle space 11 and thus also of the assembly body 40 is adapted to that of the receiver 8, so that it fits precisely fitted in the receptacle space 11 except for required installation tolerances.

The structural unit thus prepared consisting of antenna module 7 and receiver 8 is subsequently inserted into the housing 2. The sound outlet nozzle 52 passes through the eardrum-side opening 6 of the housing 2. The inner wall 24 of the housing 2 in the region of the opening 6 circumferentially encloses the adapter housing 50.

The antenna module 7, especially the winding 12, fundamentally has to be electrically connected to a non-illustrated further electronic component. To simplify the assembly of this electrical connection, in the embodiment variant according to FIG. 3, in particular a printed circuit board 54 is provided (FIG. 3B), this is, for example, shown in FIG. 3B as a strip-shaped element formed in the longitudinal direction 14, which is only formed to be arranged on one cuboid side. The printed circuit board 54 has an eardrum-side winding section 56 and a tab section 58 adjoining thereon in the longitudinal direction 14. The printed circuit board 54 is in particular a flexible printed circuit board foil. The tab section 58 can especially be curved or bent over in relation to the winding section 56, as shown by the dashed line.

For the production, the printed circuit board 54 is first laid on the assembly body 40. The assembly body can be, for example, the embodiment variant shown in FIG. 2. Subsequently, the magnetic layer 26 is applied and then the winding 12 is applied. The magnetic layer 26 is, for example, a slotted ferrite foil or also individual ferrite strips.

The printed circuit board 54 preferably has contact surfaces 60 spaced apart from one another in the longitudinal direction 14. The distance between these two contact surfaces 60 is greater than or equal to a winding length L3 of the winding 12. Winding ends (not shown in greater detail here) of the winding 12 are electrically contacted on these contact surfaces 60 by welding or soldering.

A conductor track 62 originates from each contact surface 60, which extends in the longitudinal direction 14 up into the tab section 58 and ends there at the end in particular at connection points 64 formed as connection pads. These are in particular arranged at the same height, but on the opposite side of the printed circuit board 4 in comparison to the contact surfaces 60. In the installed state, the connection points 64 are therefore oriented inward toward the intermediate space 20. They are typically used to connect a contact wire, which is then led to a further electronic component.

Figure 3A:
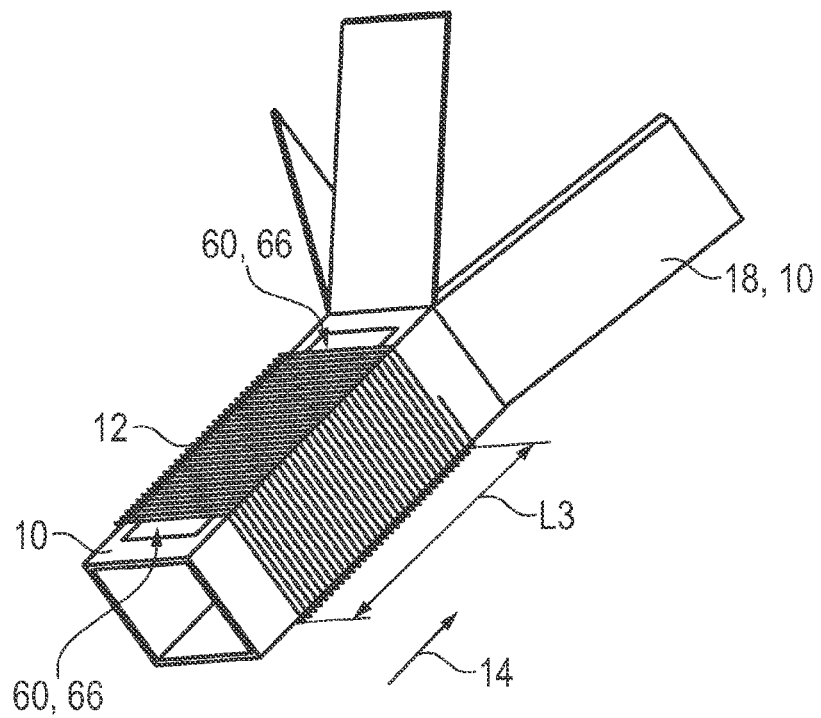
FIG. 3A is a perspective illustration to explain a second variant of the production of an antenna module.
Figure 3B:
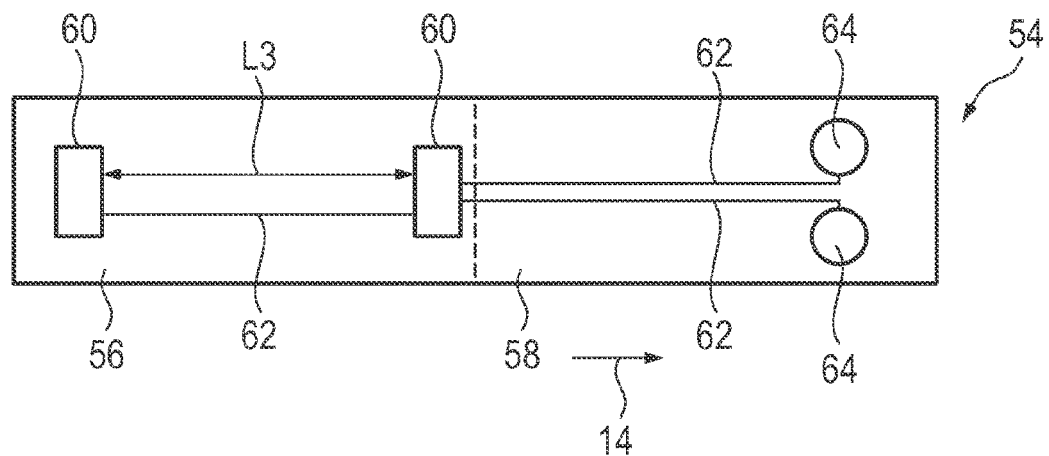
FIG. 3B is a plan view of a printed circuit board used for the variant of FIG. 3A.

As can be inferred especially in conjunction with FIG. 3A, the magnetic layer 26 has windows 66 in the region of the contact surfaces 60 to enable the contacting of the winding ends with the contact surfaces 60.

According to one preferred variant, the printed circuit board 54 has a metal layer, which is full surface in particular, in particular a copper layer, and is thus designed to be multilayer as a whole. This copper layer in particular forms the electrical shielding layer 28, so that a simple (ferrite) foil is used for the magnetic layer 26, for example.

The following embodiment variants according to FIGS. 4-6 each show an assembly body 40 formed as a hollow body, which remains in the antenna module 7.

In the production variant according to FIG. 4, the assembly body 40 is formed as a sleeve, in particular made of an insulating material (plastic sleeve) (FIG. 4B); the winding 12 is wound around this, wherein connection points 64 are formed on one cuboid side. The magnetic layer 26, in particular the shielding foil 10, is laid directly around the receiver 8 in this embodiment variant. The unit thus prepared made up of receiver 8 and shielding foil 10 is subsequently inserted into the antenna module 7.

Figure 4A:
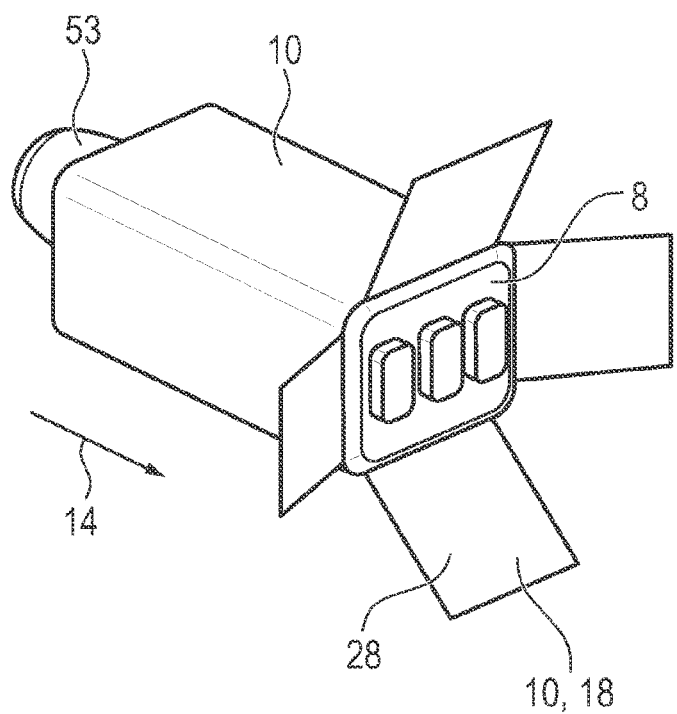
FIGS. 4A-4D show illustrations to explain a third variant of the production of an antenna module.
Figure 4B:
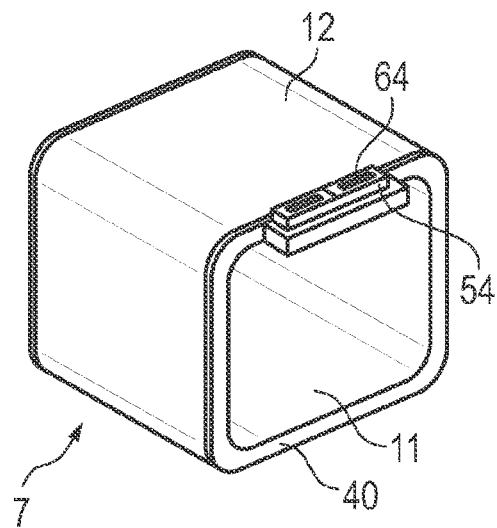
Figure 4C:
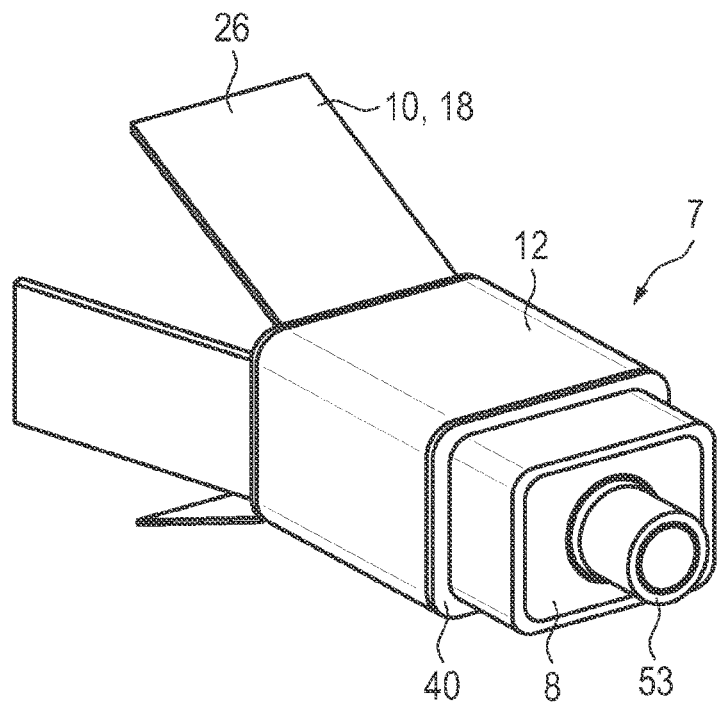

The eardrum-side end face of the receiver 8 can be seen in FIG. 4C. At this point, the receiver 8 has a sound outlet nozzle 53. At the opposite end, which is oriented in the installed state toward the intermediate space 20, a connection side is formed having multiple contact connections, which are also connected to a control unit to form electrical contacts and via which the activation of the receiver 8 takes place.

An embodiment variant modified from FIG. 4 is shown in FIG. 5. The assembly body 40 is again formed as a sleeve-shaped hollow body, in this exemplary embodiment preferably from an electrically conductive material, in particular from metal. The shielding foil 10 and then the winding 12 is first attached around this. In the receptacle space 7, which is formed in each case by the cavity of the assembly body 40, the receiver 8 is then inserted, as in the variant of FIG. 4. FIGS. 4D and 5D each show sectional illustrations of these two variants for the antenna module 7.

Figure 4D:
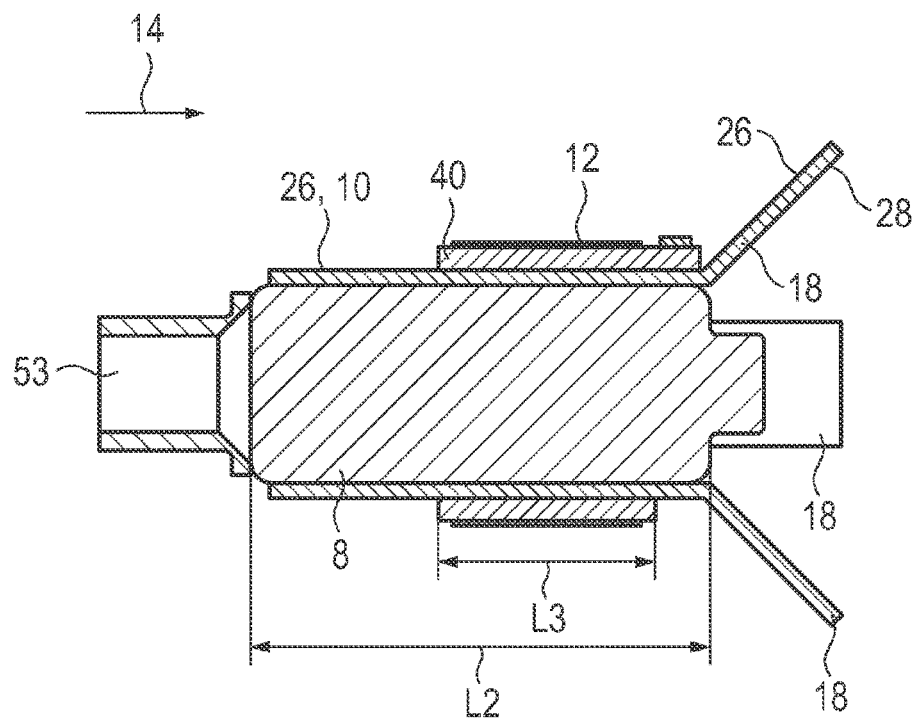
Figure 5A:
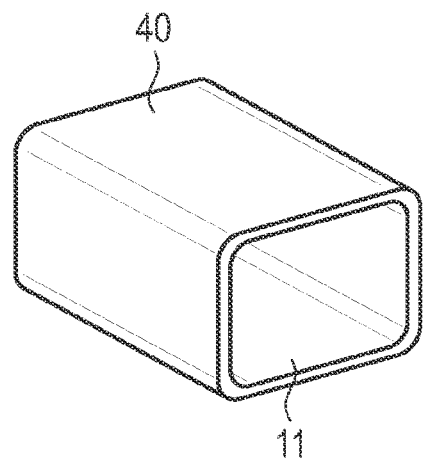
FIGS. 5A-5D show illustrations to explain a fourth variant of the production of an antenna module.
Figure 5B:
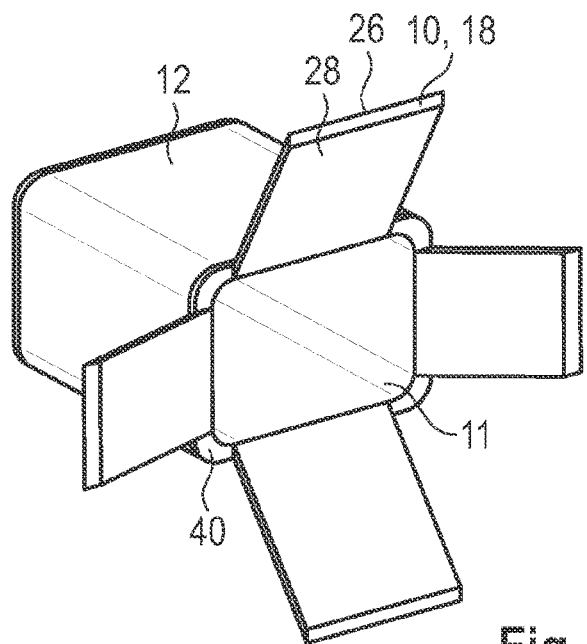
Figure 5C:
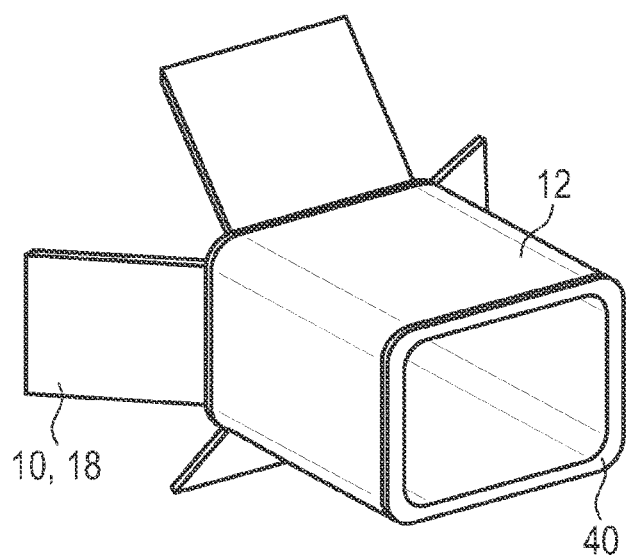
Figure 5D:
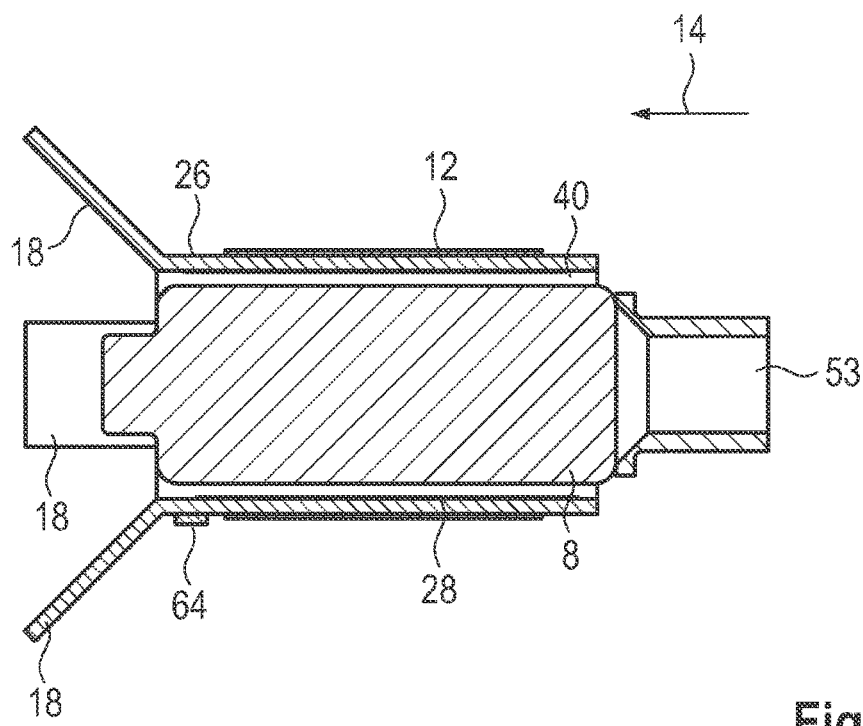

As can be seen especially on the basis of FIG. 4D, it is provided in one preferred variant that the winding length L3 of the winding 12 is less in some embodiment variants than the length L2 of the receiver 8. The winding 12 is in particular arranged here at an inner end of the receiver 8. This is understood as the end of the receiver 8 oriented toward the intermediate space 20, which thus faces away from the eardrum side.

The winding 12 is therefore spaced apart from the eardrum-side end of the receiver 8. The structural unit having the antenna module 7 and the receiver 8 is thus kept compact at the eardrum-side end, so that in this region the housing 2, which the structural unit also encloses, is also as compact as possible to occupy as little installation space as possible in the region of the upper channel. This variant is of particular interest in particular in the variants shown in FIGS. 4 and 5, in which the assembly body 40 remains as an additional component in the antenna module.

FIG. 6 shows a special variant, in which the adapter housing 50 at the same time defines the assembly body 40 formed as a hollow body. Therein, the winding 12 is wound on the outside of the adapter housing 50. A printed circuit board 54, is preferably again provided in this variant for contacting the winding 12, which has connection points 64 at the ends.

Figure 6A:
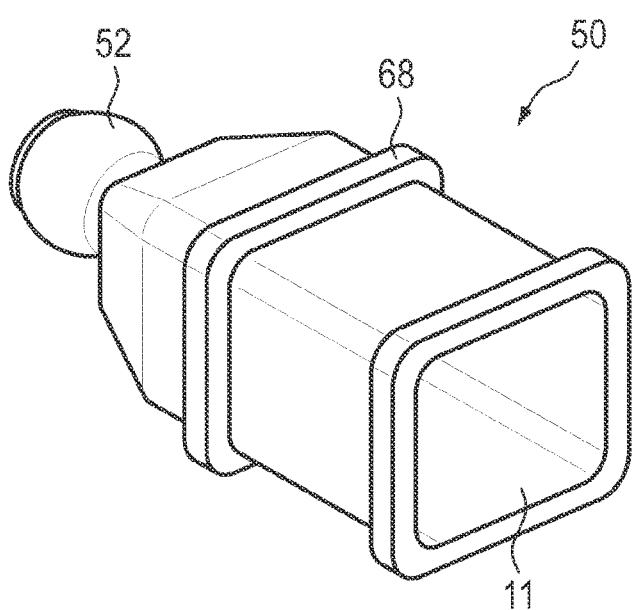
FIGS. 6A-6D show illustrations to explain a fifth variant of the production of an antenna module.
Figure 6B:
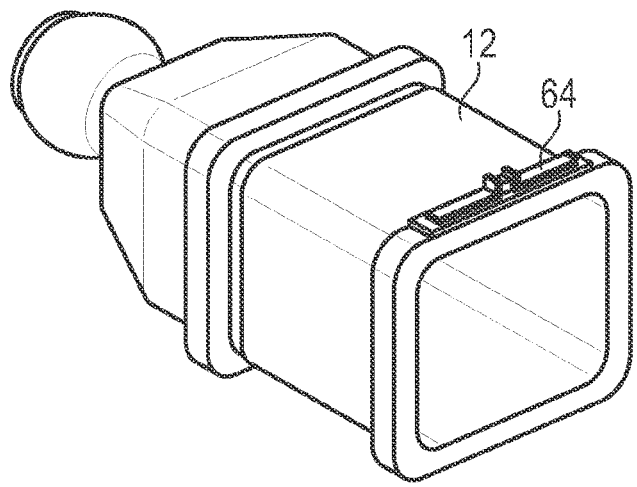
Figure 6C:
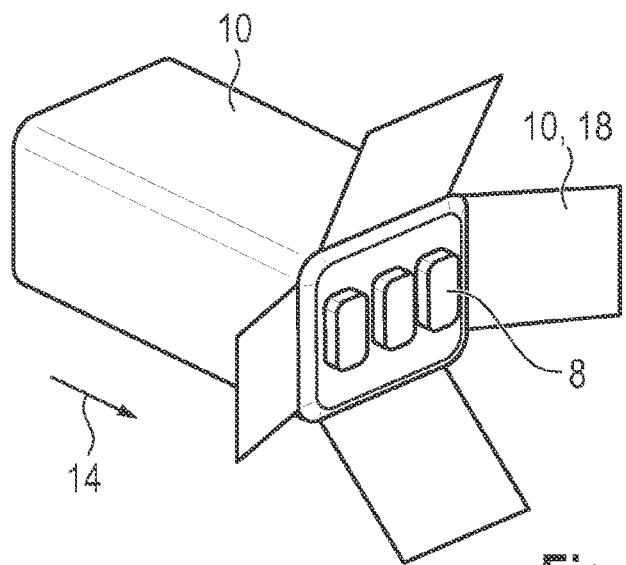
Figure 6D:
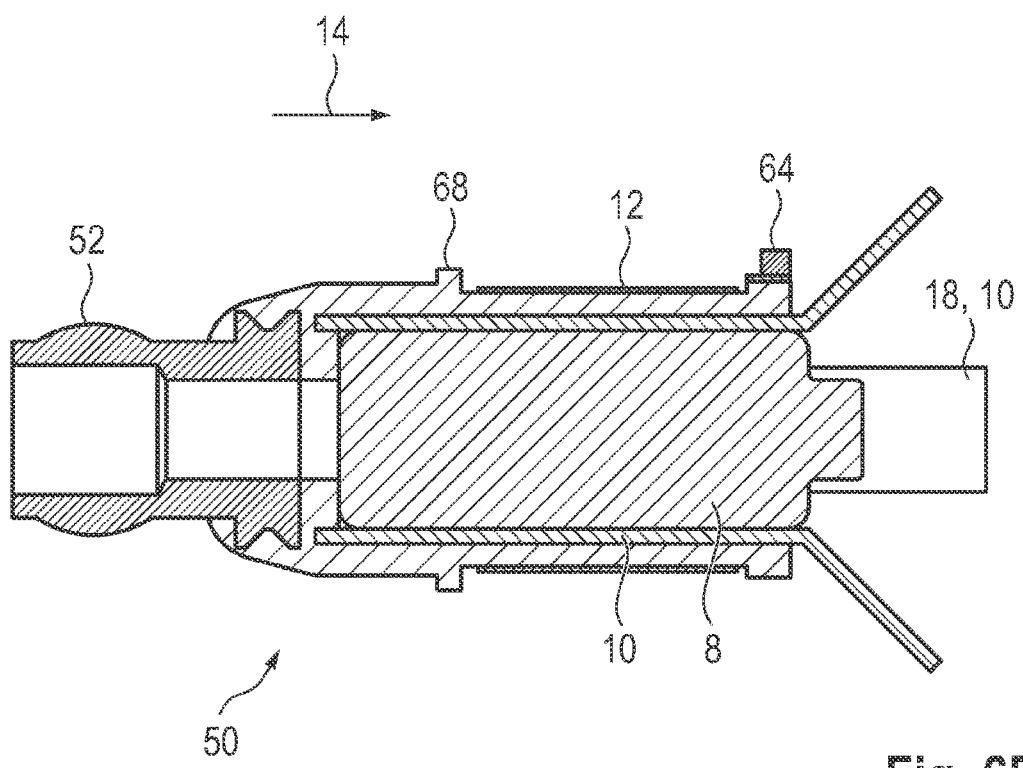

As can be seen especially from the cross-sectional illustration of FIG. 6D, the connection points 64 and the printed circuit board 54 are preferably only attached at the end on the adapter housing 50 and preferably on a somewhat raised web.

Toward the eardrum side, the adapter housing 50 has a stop 68, which is circumferential in particular and defines a stop for the housing 2. This means that the antenna module 7 is inserted from the front into the opening 6 of the housing 2 up to this circumferential stop 68. The remaining part therefore protrudes out of the housing 2. In the exemplary embodiment, for example, ¼ or more of the length of the adapter housing 50 protrudes out of the housing 2.

The winding 12 is applied in the region between the stop 68 and the opposite end of the adapter housing 80. In the exemplary embodiment, a circumferential depression is formed in the adapter housing, in which the winding 12 is inserted.

The adapter housing 50 again has a sound outlet nozzle 52, into which the sound outlet nozzle 53 of the receiver 8 is inserted. In particular an ear mold is placed on this sound outlet nozzle 52 of the adapter housing 50. This sound outlet nozzle 52 is preferably a separate part, which is used on a front end of the adapter housing 50. Alternatively, the sound outlet nozzle 52 is formed as an extruded component.

The invention was explained in more detail above in conjunction with an ITE hearing aid device. In principle, the antenna module 7 described here may also be transferred to other hearing aid devices and also in general especially to hearing aids wearable on the head. These are also understood in particular as headsets, wearables, etc. The electrical component accommodated by the antenna module 7 does not necessarily have to be the receiver 8. The antenna module 7 described here is preferably used for data transmission in the megahertz range. In addition, it is additionally or also alternatively used for inductive charging or also as a telecoil.

The invention is therefore not restricted to the exemplary embodiments described here. Rather, other variants can be derived therefrom without leaving the subject matter of the invention. In particular, all individual features described in conjunction with the exemplary embodiments are combinable with one another in other ways without leaving the subject matter of the invention.

The following is a summary list of reference numerals and the corresponding structure used in the above description of the invention:
 1 hearing aid
 2 housing
 2A first housing section
 2B second housing section
 4 interior
 6 opening
 7 antenna arrangement
 8 receiver
 10 shielding foil
 11 receptacle space
 12 winding
 14 longitudinal direction
 16 subsection
 18 tabs
 20 intermediate space
 24 inner wall
 26 magnetic layer
 28 electrical shielding layer
 40 assembly body
 42 stop
 44 winding region
 46 tab region
 48 depression
 50 adapter housing
 52 sound outlet nozzle of the adapter housing
 53 sound outlet nozzle of the receiver
 54 printed circuit board
 56 winding section
 58 tab section
 60 contact surface
 62 conductor track
 64 connection point
 66 window
 68 circumferential stop
 L1 length of assembly body
 L2 length of the receiver
 L3 winding length

The invention claimed is:

1. A method for producing a hearing aid with a housing and an antenna module arranged in the housing, the antenna module having a receptacle space, and an electronic component of the hearing aid arranged in the receptacle space, the method comprising:
  producing a prefinished antenna module by:
    providing an assembly body;
    applying a magnetic layer to the assembly body and subsequently applying a winding to the assembly body;
    the assembly body defining the receptacle space;
    alternatively forming the assembly body as a sleeve-shaped hollow body having a cavity defining the receptacle space or removing the assembly body to define the receptacle space being a free space formed by a removal of the assembly body;

subsequently introducing the electrical component into the receptacle space of the prefinished antenna module; and placing a unit formed by the electrical component and the antenna module into the housing.

2. The method according to claim 1, wherein the receptacle space and the electrical component extend in a longitudinal direction and each has a length and wherein the magnetic layer has at least one tab, which extends beyond the length of the receptacle space or the electrical component, and which delimits an intermediate space in the housing.

3. The method according to claim 1, which comprises forming an electrical shielding layer.

4. The method according to claim 1, which comprises providing the assembly body having a greater length than the electrical component.

5. The method according to claim 2, which comprises providing the assembly body having a winding region and a tab region adjoining thereon, and laying the at least one tab in a strip shape at the tab region.

6. The method according to claim 5, wherein the assembly body has a stop protruding in the radial direction opposite the tab region and adjoining the winding region.

7. The method according to claim 1, which comprises providing an adapter housing and pushing the adapter housing over a winding region and the winding located therein, or around which the winding is applied.

8. The method according to claim 1, which comprises providing a printed circuit board with contact surfaces, laying the printed circuit board on the assembly body and subsequently applying the winding and contacting the winding with the contact surfaces.

9. The method according to claim 8, which comprises providing the printed circuit board with a shielding layer.

10. The method according to claim 1, which comprises providing the assembly body formed as the hollow body and pushing the hollow body over the electrical component, wherein the magnetic layer is arranged between the hollow body and the electrical component.

11. The method according to claim 10, which comprises providing the hollow body with connection points for connecting a wire.

12. A method for producing an antenna module for a hearing aid, the antenna module having a receptacle space for receiving an electronic component, the method comprising:

providing an assembly body;

applying a magnetic layer to the assembly body and subsequently applying a winding to the assembly body; and defining the receptacle space with the assembly body by alternatively:

forming the assembly body as a hollow body having a cavity defining the receptacle space or removing the assembly body to create a free space defining the receptacle space.

* * * * *